(12) United States Patent
Kim et al.

(10) Patent No.: US 9,240,460 B2
(45) Date of Patent: Jan. 19, 2016

(54) METHODS OF FORMING SEMICONDUCTOR DEVICES INCLUDING AN EMBEDDED STRESSOR, AND RELATED APPARATUSES

(71) Applicant: Samsung Electronics Co., Ltd., Suwon-si (KR)

(72) Inventors: Jun-Suk Kim, Goyang-si (KR); Kee-Moon Chun, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/323,007

(22) Filed: Jul. 3, 2014

(65) Prior Publication Data
US 2015/0140757 A1    May 21, 2015

(30) Foreign Application Priority Data
Nov. 19, 2013   (KR) .................. 10-2013-0140655

(51) Int. Cl.
*H01L 21/336* (2006.01)
*H01L 29/66* (2006.01)
*H01L 29/78* (2006.01)
*H01J 37/32* (2006.01)

(52) U.S. Cl.
CPC ...... *H01L 29/66545* (2013.01); *H01L 29/6681* (2013.01); *H01L 29/66681* (2013.01); *H01L 29/66795* (2013.01); *H01L 29/7848* (2013.01); *H01J 37/32669* (2013.01); *H01L 29/7854* (2013.01)

(58) Field of Classification Search
CPC .................. H01L 29/66545; H01L 29/66681; H01L 29/6681; H01L 21/67069
USPC ......................................... 438/283
See application file for complete search history.

(56) References Cited

U.S. PATENT DOCUMENTS

| 7,221,032 | B2 | 5/2007 | Kondo |
| 2007/0054447 | A1 | 3/2007 | Tai et al. |
| 2008/0237741 | A1 | 10/2008 | Ranade et al. |
| 2011/0147842 | A1 | 6/2011 | Cappellani et al. |

OTHER PUBLICATIONS

Chen et al., "Chemical Oxide Interfacial Layer for the High-*k*-Last/Gate-Last Integration Scheme", IEEE Electron Device Letters, vol. 33, No, 7, Jul. 2012, pp. 946-948.

*Primary Examiner* — Reema Patel
*Assistant Examiner* — Syed Gheyas
(74) *Attorney, Agent, or Firm* — Myers Bigel Sibley & Sajovec, PA

(57) ABSTRACT

Methods of forming semiconductor devices are provided. A method of forming a semiconductor device includes forming preliminary trenches adjacent opposing sides of an active region. The method includes forming etching selection regions in portions of the active region that are exposed after forming the preliminary trenches. The method includes forming trenches by removing the etching selection regions. Moreover, the method includes forming a stressor in the trenches. Related apparatuses are also provided.

20 Claims, 22 Drawing Sheets

METHODS OF FORMING SEMICONDUCTOR DEVICES INCLUDING AN EMBEDDED STRESSOR, AND RELATED APPARATUSES

CROSS-REFERENCE TO RELATED APPLICATION

This application claims priority under 35 U.S.C. §119 to Korean Patent Application No. 10-2013-0140655, filed on Nov. 19, 2013, the disclosure of which is hereby incorporated herein by reference in its entirety.

BACKGROUND

The present disclosure herein relates to methods of forming semiconductor devices. Strain technologies have been studied in an attempt to improve electrical characteristics of semiconductor devices. Such technologies, however, may be difficult to apply to some types of semiconductor device structures.

SUMMARY

Various embodiments of present inventive concepts provide a method of forming a semiconductor device. The method may include forming a gate structure on a fin active region that is on a substrate. The method may include forming preliminary trenches by anisotropically etching the fin active region. The method may include forming etching selection regions in portions of the fin active region that are exposed by the preliminary trenches, where the etching selection regions have a first impurity concentration that is higher than a second impurity concentration in the fin active region. The method may include forming trenches in the fin active region adjacent opposing sides of the gate structure, by removing the etching selection regions. Moreover, the method may include forming a stressor in the trenches.

In various embodiments, forming the preliminary trenches may include forming the preliminary trenches such that sidewalls of the preliminary trenches are substantially perpendicular to a surface of the substrate. In some embodiments, forming the trenches may include forming sidewalls of the trenches in parallel to where sidewalls of the preliminary trenches were formed.

According to various embodiments, the gate structure may include a temporary gate structure, forming the gate structure may include forming the temporary gate structure on the fin active region, and forming the trenches may include forming the trenches in the fin active region adjacent opposing sides of the temporary gate structure. In some embodiments, the method may include removing the temporary gate structure and forming a gate electrode on the fin active region. In some embodiments, the method may include forming a spacer on a sidewall of the temporary gate structure, where forming the etching selection regions may include forming one of the etching selection regions to undercut the spacer. Moreover, forming the gate structure may include forming the gate structure on opposing sides of the fin active region, forming the preliminary trenches may include forming the preliminary trenches after forming the spacer.

In various embodiments, forming the etching selection regions may include forming the etching selection regions with a uniform thickness adjacent the preliminary trenches. In some embodiments, forming the etching selection regions may include forming the etching selection regions such that a horizontal width of portions of the etching selection regions on/defining sidewalls of the preliminary trenches is greater than a vertical thickness of portions of the etching selection regions that are perpendicular to the horizontal width. Alternatively, forming the etching selection regions may include forming the etching selection regions such that a horizontal width of portions of the etching selection regions on/defining sidewalls of the preliminary trenches equals a vertical thickness of portions of the etching selection regions that are perpendicular to the horizontal width.

According to various embodiments, forming the etching selection regions may include loading the substrate that includes the preliminary trenches into a plasma chamber, applying an electric field and/or a magnetic field to a side surface and a rear surface of the substrate, and implanting impurities into the portions of the fin active region that are exposed by the preliminary trenches. Moreover, in some embodiments, the plasma chamber may include a horizontal field applying apparatus adjacent the side surface of the substrate and a vertical field applying apparatus adjacent the rear surface of the substrate. Applying the electric field and/or the magnetic field may include applying the electric field and/or the magnetic field via the horizontal field applying apparatus and the vertical field applying apparatus.

In various embodiments, a manufacturing apparatus may be configured to form the etching selection regions described herein. The manufacturing apparatus may include a chamber, a plasma generator in the chamber, a holder that is in the chamber and is configured to seat the substrate at a location opposite the plasma generator, a horizontal field applying apparatus that is mounted on the holder and is adjacent a side surface of the substrate, and a vertical field applying apparatus that is on the holder and is adjacent a rear surface of the substrate.

A method of forming a semiconductor device, according to various embodiments, may include defining an active region on a substrate and forming a gate structure on the active region. The method may include forming preliminary trenches by anisotropically etching the active region. The method may include forming etching selection regions in portions of the active region that are exposed by the preliminary trenches, where the etching selection regions have a first impurity concentration that is higher than a second impurity concentration in the active region. The method may include forming trenches in the active region adjacent opposing sides of the gate structure, by removing the etching selection regions. The method may include forming lightly doped drains (LDDs) in portions of the active region that are exposed by the trenches. Moreover, the method may include forming a stressor on the LDDs. In some embodiments, forming the LDDs may include forming each of the LDDs to a uniform thickness in the active region.

A method of forming a semiconductor device, according to various embodiments, may include forming first and second preliminary trenches adjacent opposing first and second sides of a fin-shaped active region, respectively. The method may include forming first and second etching selection regions in portions of the fin-shaped active region that are exposed after forming the first and second preliminary trenches, by adding impurities to the portions of the fin-shaped active region. The method may include forming first and second trenches by removing the first and second etching selection regions, respectively. Moreover, the method may include forming first and second stressors in the first and second trenches, respectively.

In various embodiments, the method may include forming first and second lightly doped drains (LDDs) to a uniform width in portions of the fin-shaped active region that are exposed after forming the first and second trenches, respectively. Forming the first and second stressors may include forming the first and second stressors after forming the first and second LDDs. Moreover, the method may include forming a gate structure on the fin-shaped active region after forming the first and second stressors.

According to various embodiments, forming the first and second etching selection regions by adding impurities to the portions of the fin-shaped active region may include forming the first and second etching selection regions by implanting the impurities into the fin-shaped active region. Moreover, in some embodiments, the fin-shaped active region may be on a substrate, and forming the first and second etching selection regions may include loading the substrate into a plasma chamber. The plasma chamber may include a horizontal field applying apparatus adjacent a side surface of the substrate, as well as a vertical field applying apparatus adjacent a rear surface (e.g., a surface perpendicular to the side surface) of the substrate. Forming the first and second etching selection regions may include implanting the impurities by applying an electric field and/or a magnetic field via the horizontal field applying apparatus and the vertical field applying apparatus to the substrate.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
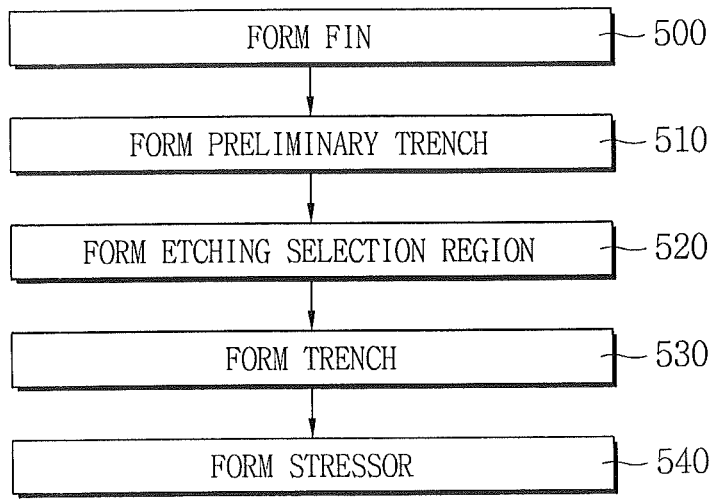
FIG. 1 is a flow chart for describing a method of forming a semiconductor device in accordance with various embodiments of present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

The term "near" is intended to mean that one among two or more components is located within relatively close proximity of a certain other component. For example, it should be understood that when a first end is near a first side, the first end may be closer to the first side than a second end, or the first end may be closer to the first side than to a second side.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 2:
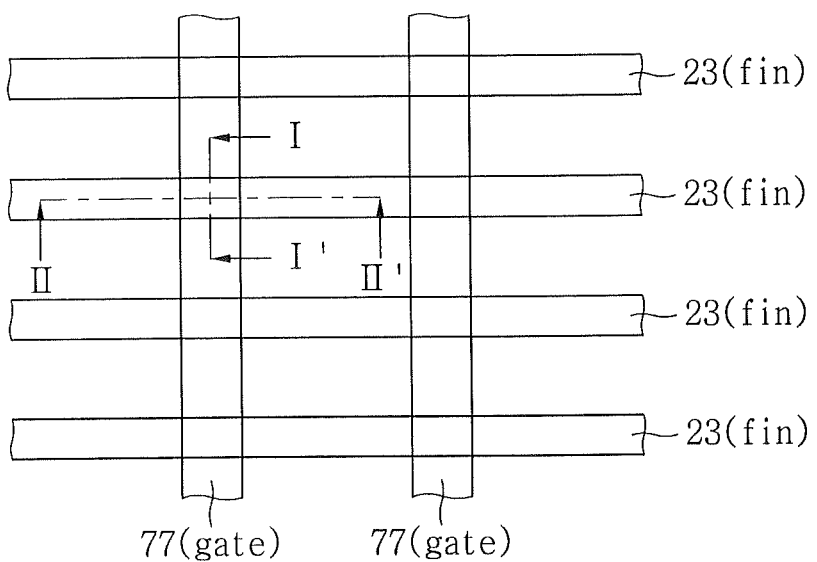
FIG. 2 is a layout for describing a method of forming a semiconductor device in accordance with various embodiments of present inventive concepts.
Figure 20:
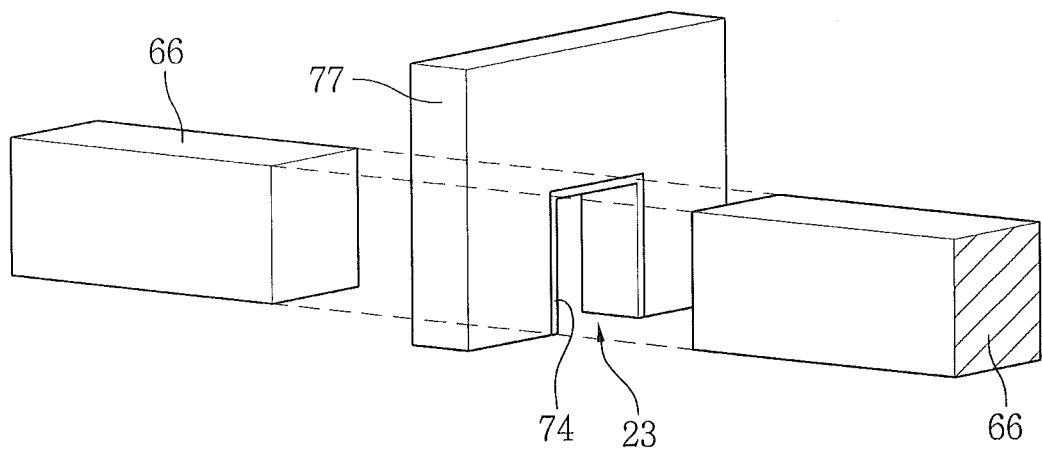
FIGS. 20 and 21 are perspective views for describing a semiconductor device in accordance with various embodiments of present inventive concepts.
Figure 21:
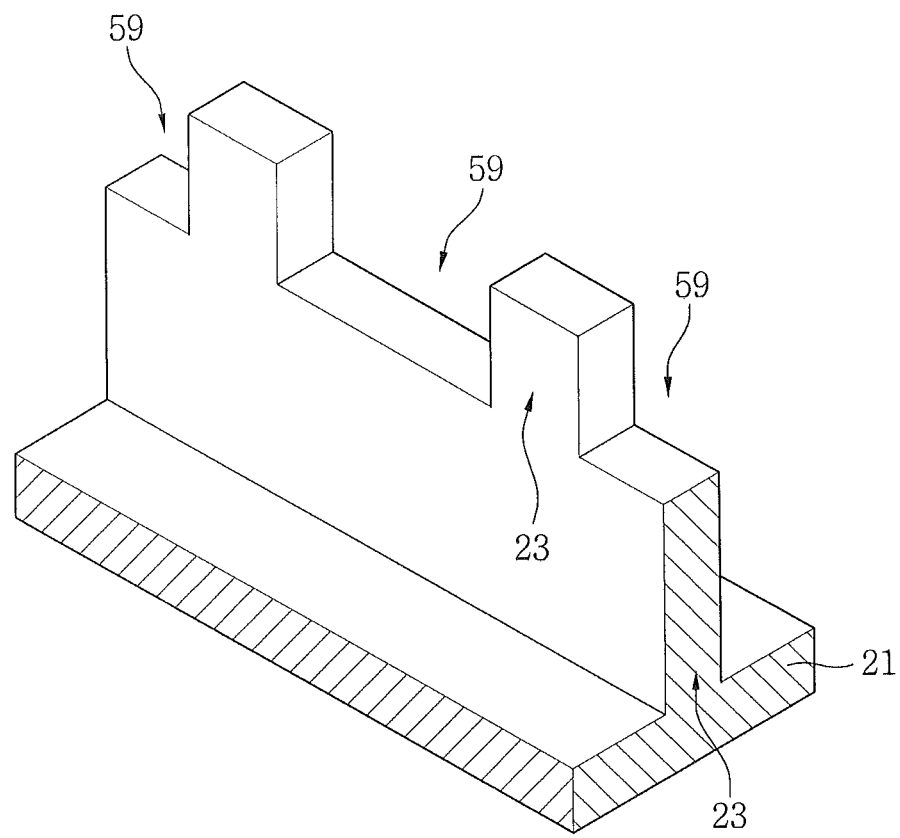
Figure 22:
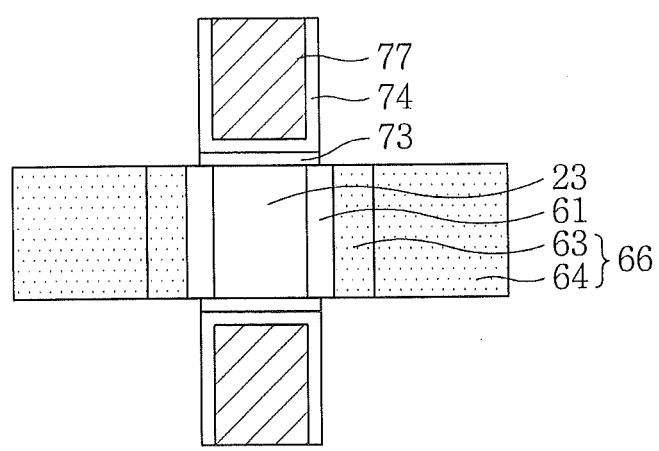
FIG. 22 is a horizontal cross-sectional view of FIG. 20.

FIG. 1 is a flow chart for describing a method of forming a semiconductor device in accordance with various embodiments of present inventive concepts, FIG. 2 is a layout for describing a method of forming a semiconductor device in accordance with various embodiments of present inventive concepts, and FIGS. 3 to 11 and 13 to 19 are cross-sectional views taken along lines I-I' and II-II' of FIG. 2 for describing a method of forming a semiconductor device in accordance with various embodiments of present inventive concepts. FIG. 12 is an enlarged view showing a part of FIG. 11 in detail. FIGS. 20 and 21 are perspective views for describing a semiconductor device in accordance with various embodiments of present inventive concepts, and FIG. 22 is a horizontal cross-sectional view of FIG. 20.

Referring to FIG. 1, a method of forming a semiconductor device in accordance with various embodiments of present inventive concepts herein may include forming a fin (Block 500), forming a preliminary trench (Block 510), forming an etching selection region (Block 520), forming a trench (Block 530) and forming a stressor (Block 540). Hereinafter, a method (e.g., a method according to the flowchart illustrated in FIG. 1) of forming a semiconductor device will be described with reference to process drawings in detail.

Figure 3:
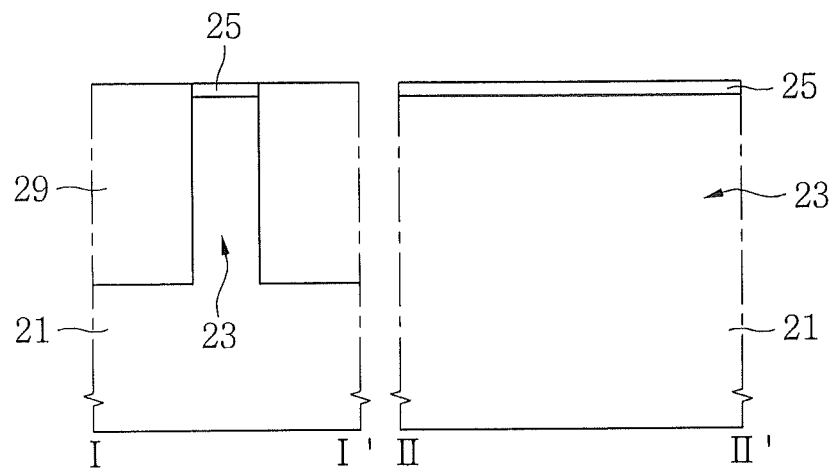
FIGS. 3 to 11 and 13 to 19 are cross-sectional views taken along lines I-I' and II-II' of FIG. 2 for describing a method of forming a semiconductor device in accordance with various embodiments of present inventive concepts.

Referring to FIGS. 1, 2 and 3, an isolation layer 29 defining an active region 23 may be formed on a substrate 21. A buffer layer 25 may cover an upper surface of the active region 23.

The substrate 21 may be a semiconductor substrate such as a silicon wafer or a silicon on insulator (SOI) wafer. For example, the substrate 21 may include single-crystalline silicon having P-type impurities. The active region 23 may have various shapes such as a fin shape or wire shape. For example, the active region 23 may include single-crystalline silicon having a fin shape. A major axis (e.g., a lengthwise axis) of the fin may extend a relatively long distance in comparison with another axis of the fin (e.g., an axis that is perpendicular to the major axis). The isolation layer 29 may be formed by a shallow trench isolation (STI) technique. The isolation layer 29 may include an insulating layer such as silicon oxide, silicon nitride, silicon oxynitride, or a combination thereof. Moreover, the buffer layer 25 may include an insulating layer such as silicon oxide, silicon nitride, silicon oxynitride, or a combination thereof.

Figure 4:
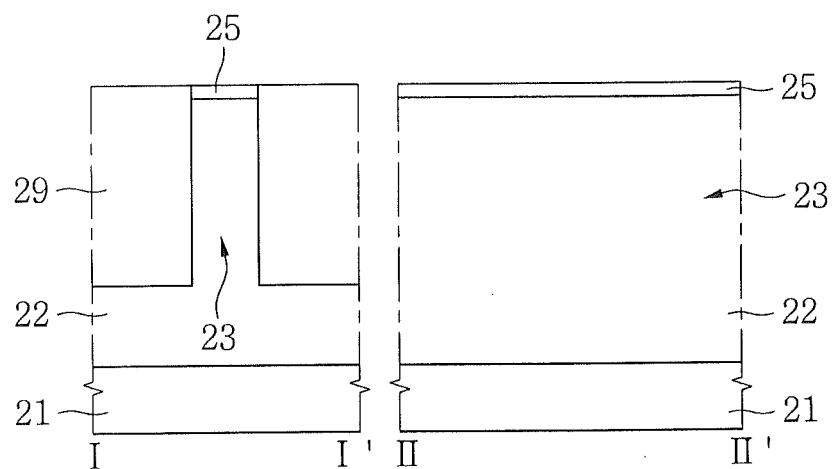

Referring to FIGS. 1, 2 and 4, an N-well 22 may be formed on a predetermined area of the substrate 21. The active region 23 may be defined/provided on the N-well 22. Channel ions may be implanted into the active region 23. The active region 23 may include impurities having the same type as the N-well 22. The N-well 22 may be formed by implanting impurities having a different conductivity type from the substrate 21. For example, the N-well 22 may be formed by implanting N-type impurities to a predetermined depth from a surface of the substrate 21. The substrate 21 may include boron (B), and the N-well 22 may include arsenic (As), phosphorus (P), or a combination thereof.

In some embodiments, the N-well 22 may be formed before the isolation layer 29 is formed. Moreover, in some embodiments, the N-well 22 may be omitted altogether.

Figure 5:
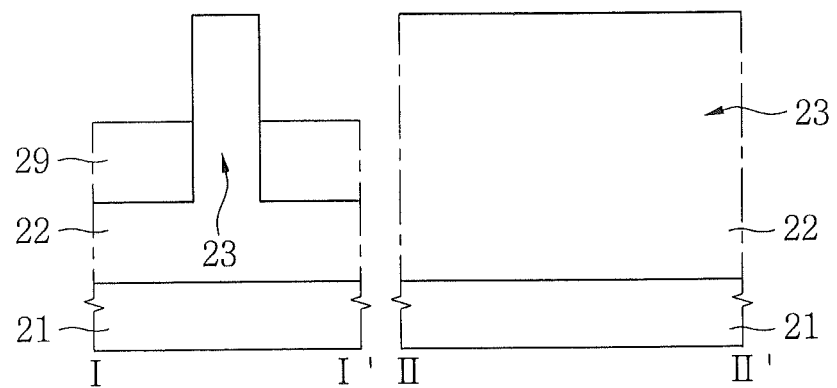

Referring to FIGS. 1, 2 and 5, side surfaces of the active region 23 may be exposed by recessing the isolation layer 29. The isolation layer 29 may remain at a lower level than a top of the active region 23. While recessing the isolation layer 29, the buffer layer 25 may also be removed. The upper surface of the active region 23 may be exposed. An etch-back process may be applied when recessing the isolation layer 29.

Figure 6:
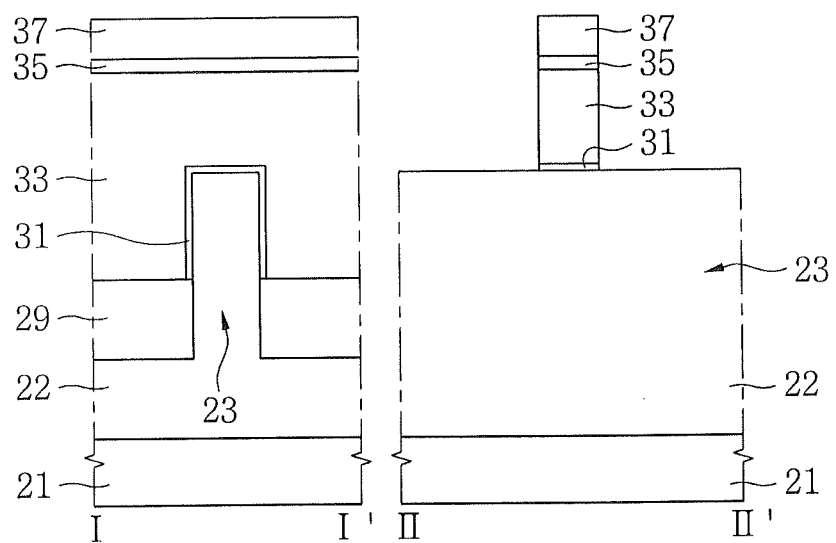

Referring to FIGS. 1, 2 and 6, a temporary gate dielectric layer 31, a temporary gate electrode 33, a buffer pattern 35 and a mask pattern 37 may be formed on the active region 23. The buffer pattern 35 and the mask pattern 37 may configure/provide/form a hard mask pattern. The temporary gate electrode 33 may be formed by a thin film forming process, a chemical mechanical polishing/planarization (CMP) process and/or a patterning process. The temporary gate dielectric layer 31, the temporary gate electrode 33, the buffer pattern 35 and the mask pattern 37 may be referred to as a temporary gate structure.

The temporary gate electrode 33 may cross/overlie the active region 23. The temporary gate electrode 33 may cover side surfaces and an upper surface of the active region 23. A bottom surface of the temporary gate electrode 33 may be formed at a lower level than a top surface of the active region 23. The temporary gate dielectric layer 31 may be formed between the active region 23 and the temporary gate electrode 33. The temporary gate dielectric layer 31 may include an insulating layer such as silicon oxide, silicon nitride, silicon oxynitride, or a combination thereof. The temporary gate electrode 33 may include polysilicon. The buffer pattern 35 may include silicon oxide. The mask pattern 37 may include silicon nitride.

Figure 7:
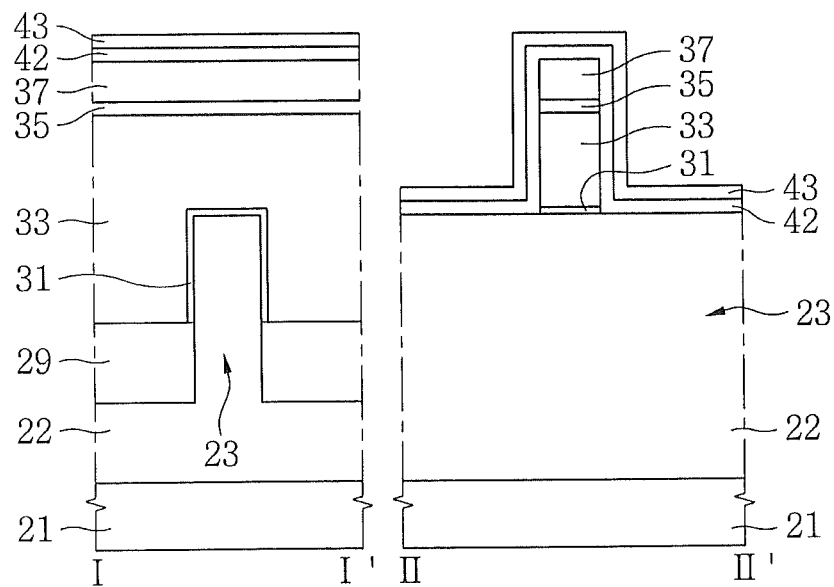
Figure 8:
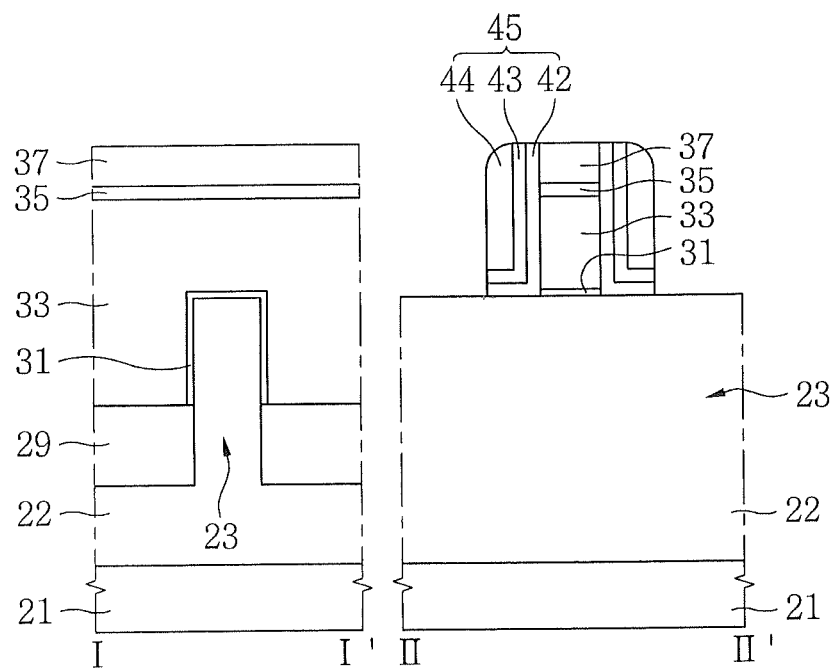

Referring to FIGS. 1, 2 and 7, an inner spacer 42 and a middle spacer 43 may be sequentially formed on side surfaces of the temporary gate structure 31, 33, 35 and 37. Referring to FIGS. 1, 2 and 8, an outer spacer 44 may be formed on the middle spacer 43. The inner spacer 42, the middle spacer 43 and the outer spacer 44 may configure/provide/form a spacer 45. A plurality of thin film forming processes and anisotropic etching processes may be applied to form the spacer 45. The spacer 45 may cover side surfaces of the temporary gate structure 31, 33, 35 and 37. An upper surface of the active region 23 may be exposed adjacent the spacer 45.

The spacer 45 may include an insulating layer such as silicon oxide, silicon nitride, silicon oxynitride, or a combination thereof. For example, the inner spacer 42 may include silicon oxide, the middle spacer 43 may include silicon nitride, and the outer spacer 44 may include silicon oxide.

Figure 9:
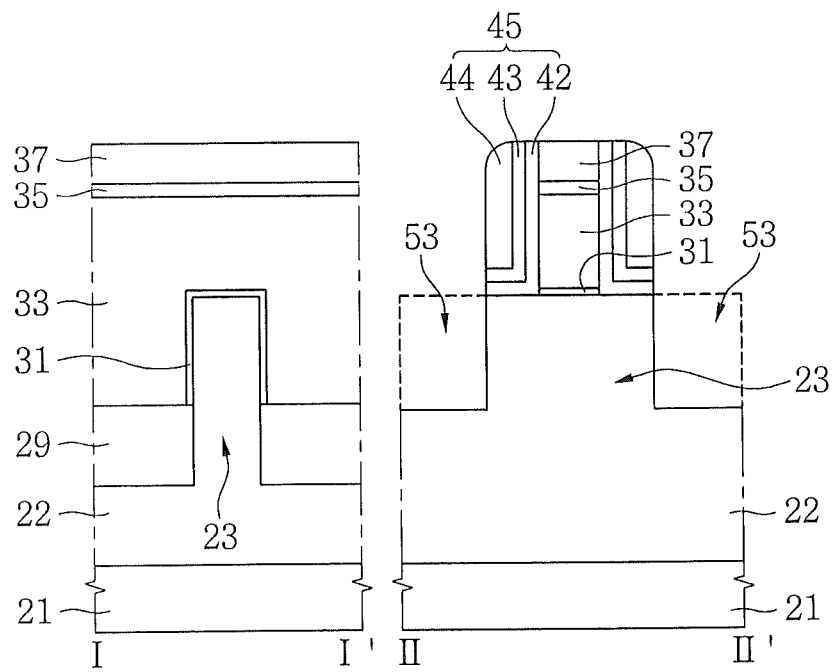

Referring to FIGS. 1, 2 and 9, preliminary trenches 53 may be formed by etching the active region 23 (Block 510). An anisotropic etching process may be applied to form the preliminary trenches 53. For example, an anisotropic etching process using the mask pattern 37 and the spacer 45 as an etch mask and using Hydrogen Bromide (HBr), Tetrafluoromethane ($CF_4$), Molecular Oxygen ($O_2$), Chlorine Gas ($Cl_2$), Nitrogen Trifluoride ($NF_3$), or a combination thereof may be applied to form the preliminary trenches 53. The preliminary trenches 53 may be adjacent the spacer 45. Each of the preliminary trenches 53 may have a U shape. The active region 23 may be exposed on the sidewalls and bottom surfaces of the preliminary trenches 53. The sidewalls of the preliminary trenches 53 may have a substantially vertical profile with respect to a surface of the substrate 21. A sidewall of one of the preliminary trenches 53 may be vertically aligned with an outside surface of the spacer 45.

Figure 10:
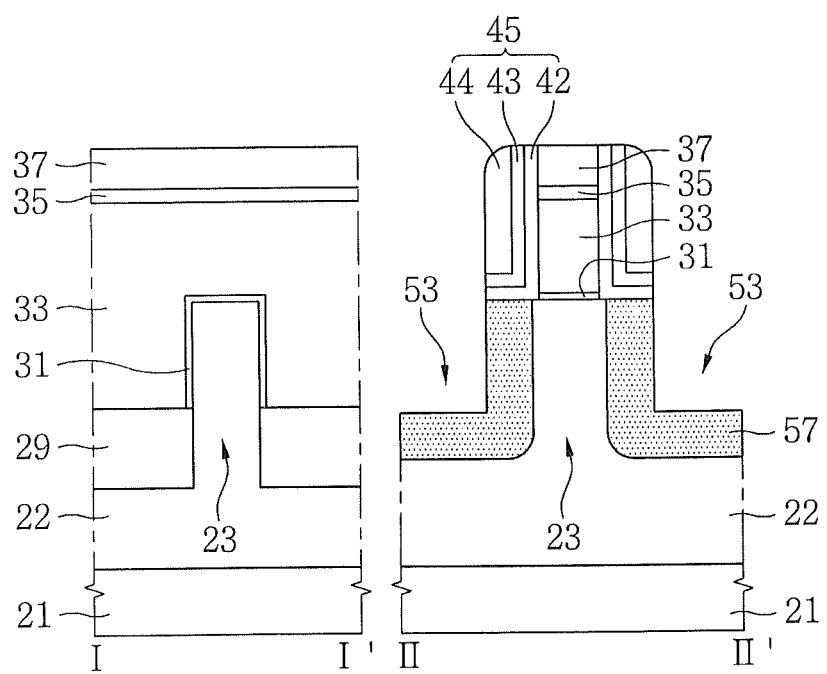

Referring to FIGS. 1, 2 and 10, etching selection regions 57 may be formed in portions of the active region 23 that are exposed by the preliminary trenches 53 (e.g., surfaces of the portions of the active region 23 that are exposed after/by forming the preliminary trenches 53) (Block 520).

Figure 32:
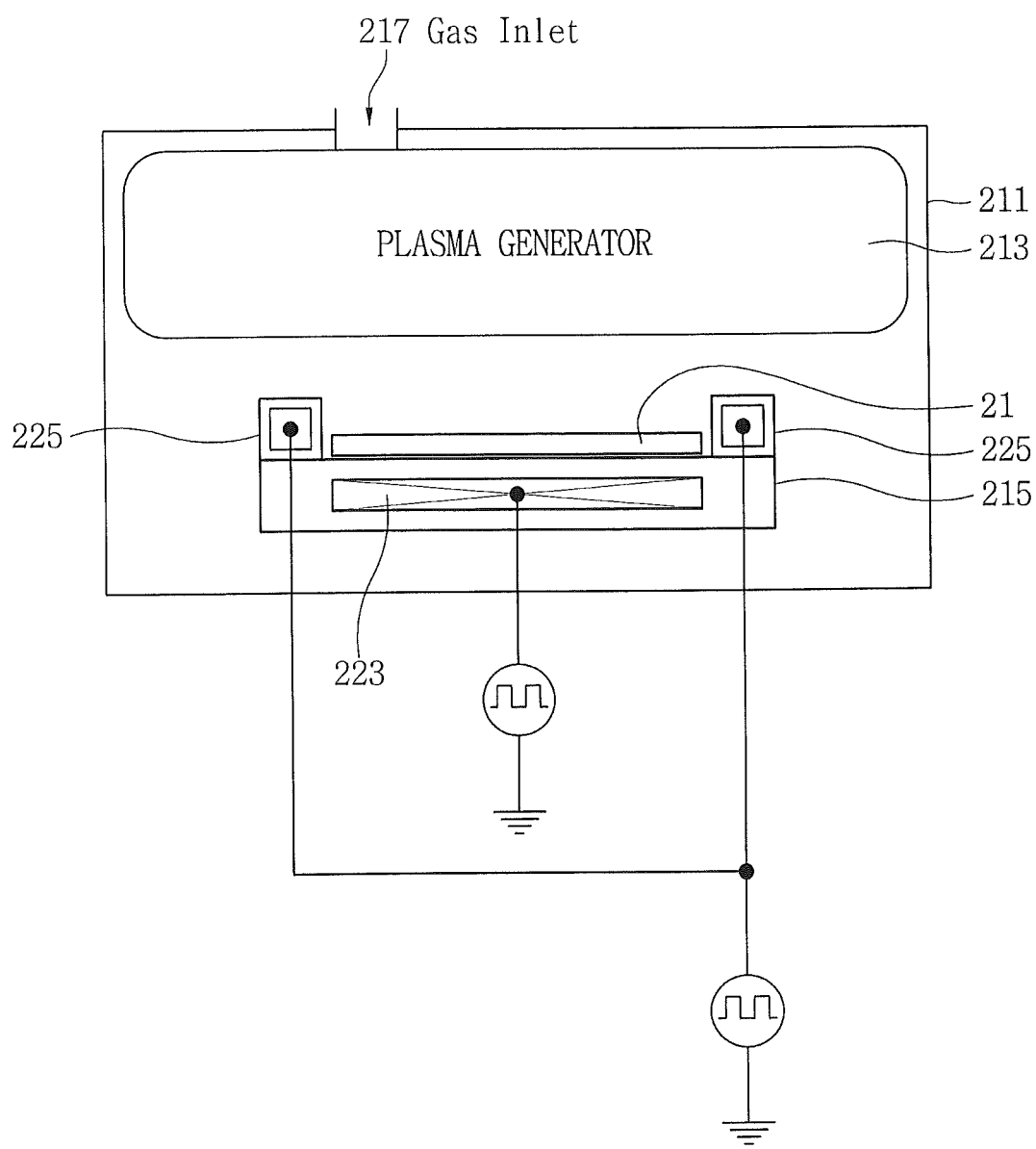
FIG. 32 is a schematic block diagram for describing a manufacturing apparatus configured to be applied to form a semiconductor device in accordance with various embodiments of present inventive concepts.
Figure 33:
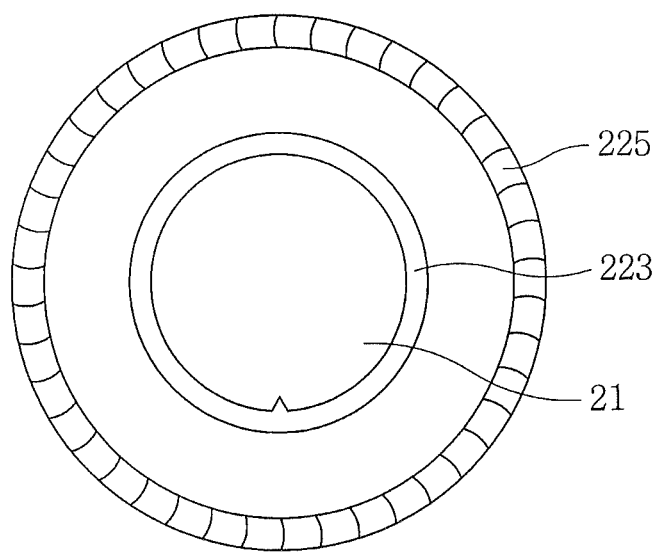
FIGS. 33 and 34 are top views showing arrangement relations of some elements of the apparatus in FIG. 32.
Figure 34:
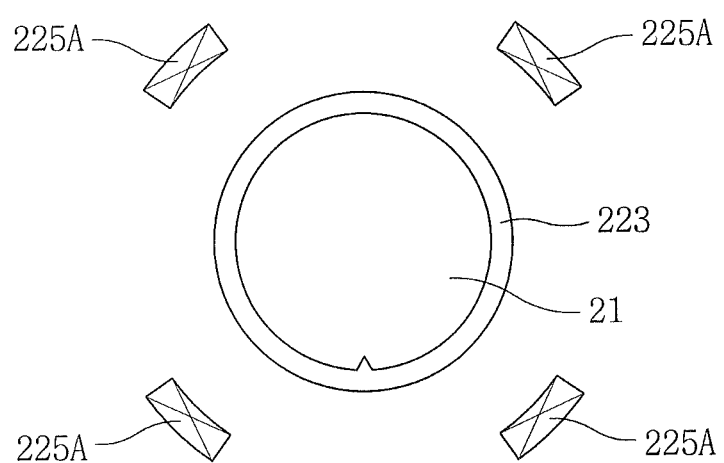

FIG. 32 is a schematic block diagram for describing a manufacturing apparatus configured to be applied to form a semiconductor device in accordance with various embodiments of present inventive concepts, and FIGS. 33 and 34 are top views showing arrangement relations of some elements of the apparatus in FIG. 32. The manufacturing apparatus in accordance with various embodiments of present inventive concepts may be a plasma ion implanting apparatus.

Referring to FIG. 32, the manufacturing apparatus in accordance with various embodiments of present inventive concepts may include a plasma chamber 211, a plasma generator 213, a holder 215, a gas inlet 217, a vertical field applying apparatus 223, and a horizontal field applying apparatus 225.

The plasma chamber 211 may include a low pressure chamber. The gas inlet 217 may connect to the plasma generator 213. The plasma generator 213 may serve to supply a plasma gas into the plasma chamber 211. The holder 215 may be disposed opposite the plasma generator 213 in the plasma chamber 211. The substrate 21 having the preliminary trenches 53 may be seated on the holder 215. The substrate 21 may be disposed between the plasma generator 213 and the holder 215. The holder 215 may serve (e.g., may be configured) to move the substrate 21 in horizontal and vertical directions and to rotate the substrate 21.

The vertical field applying apparatus 223 may be disposed adjacent a rear surface of the substrate 21. For example, the vertical field applying apparatus 223 may be disposed in the holder 215. The substrate 21 may be disposed between the plasma generator 213 and the vertical field applying apparatus 223. The vertical field applying apparatus 223 may be in contact with a pulse supply. The horizontal field applying apparatus 225 may be disposed adjacent a side surface of the substrate 21. For example, the horizontal field applying apparatus 225 may be disposed on an edge of the holder 215. The horizontal field applying apparatus 225 may be in contact with the pulse supply. The vertical field applying apparatus 223 and the horizontal field applying apparatus 225 may serve to apply a field to the substrate 21 and near the substrate 21. The field may include an electric field and/or a magnetic field.

Referring to FIG. 33, the horizontal field applying apparatus 225 may be a ring-type apparatus surrounding the substrate 21. Referring to FIG. 34, horizontal field applying apparatuses 225A may be distributed and disposed near the substrate 21.

Referring again to FIGS. 1, 2, 10 and 32, the substrate 21 may be seated on the holder 215. The active region 23 exposed in/by the preliminary trenches 53 may be opposite the plasma generator 213. The etching selection regions 57 may be formed by a plasma ion implanting process. For example, the plasma ion implanting process may include applying a field to rear and side surfaces of the substrate 21 using the vertical field applying apparatus 223 and the horizontal field applying apparatus 225, and implanting impurities into portions of the active region 23 exposed in/by the preliminary trenches 53.

The etching selection regions 57 may include boron (B), phosphorus (P), arsenic (As), or a combination thereof. The etching selection regions 57 may include impurities having a higher concentration than other regions of the active region 23. The etching selection regions 57 may include impurities having a different type from other regions of the active region 23. For example, the active region 23 may include single-crystalline silicon such as arsenic (As) or phosphorus (P), and the etching selection regions 57 may be formed by implanting boron (B) into the active region 23. The etching selection regions 57 may include boron (B) of 5E10 atoms/$cm^3$ to 5E20 atoms/$cm^3$. The etching selection regions 57 may be changed to an amorphous state by a plasma ion implanting process.

The vertical field applying apparatus 223 and the horizontal field applying apparatus 225 may serve to control thicknesses and shapes of the etching selection regions 57. The etching selection regions 57 formed on/adjacent a top region of the preliminary trenches 53 may have the same horizontal width as the etching selection regions 57 formed on/adjacent a middle region of the preliminary trenches 53. A horizontal width of the etching selection regions 57 formed on/adjacent the sidewalls of the preliminary trenches 53 may be equal to a vertical thickness of the etching selection regions 57 formed on the bottom of the preliminary trenches 53.

In some embodiments, the horizontal width of the etching selection regions 57 formed on/adjacent the sidewalls of the preliminary trenches 53 may be greater than the vertical thickness of the etching selection regions 57 formed on/adjacent the bottom of the preliminary trenches 53.

Figure 11:
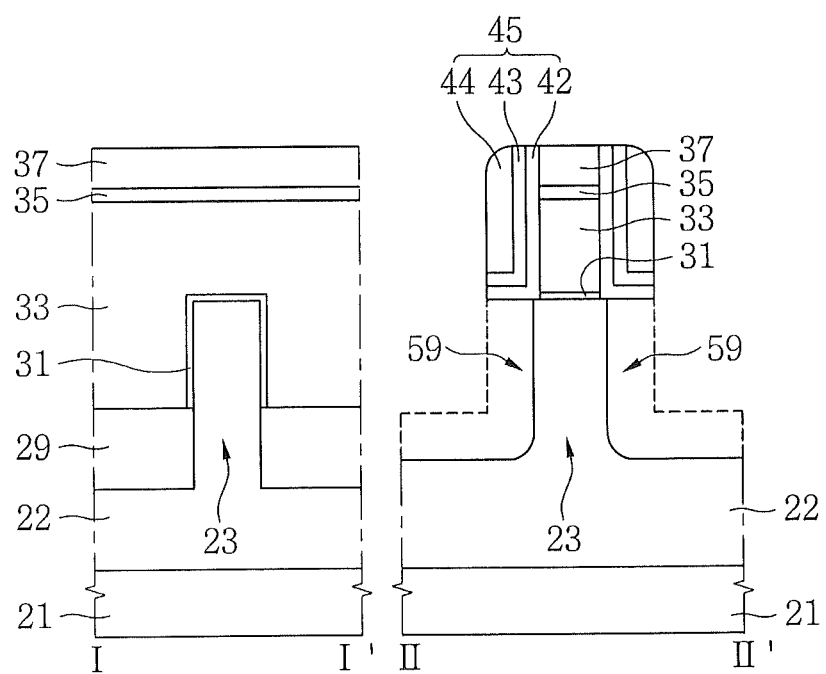
Figure 12:
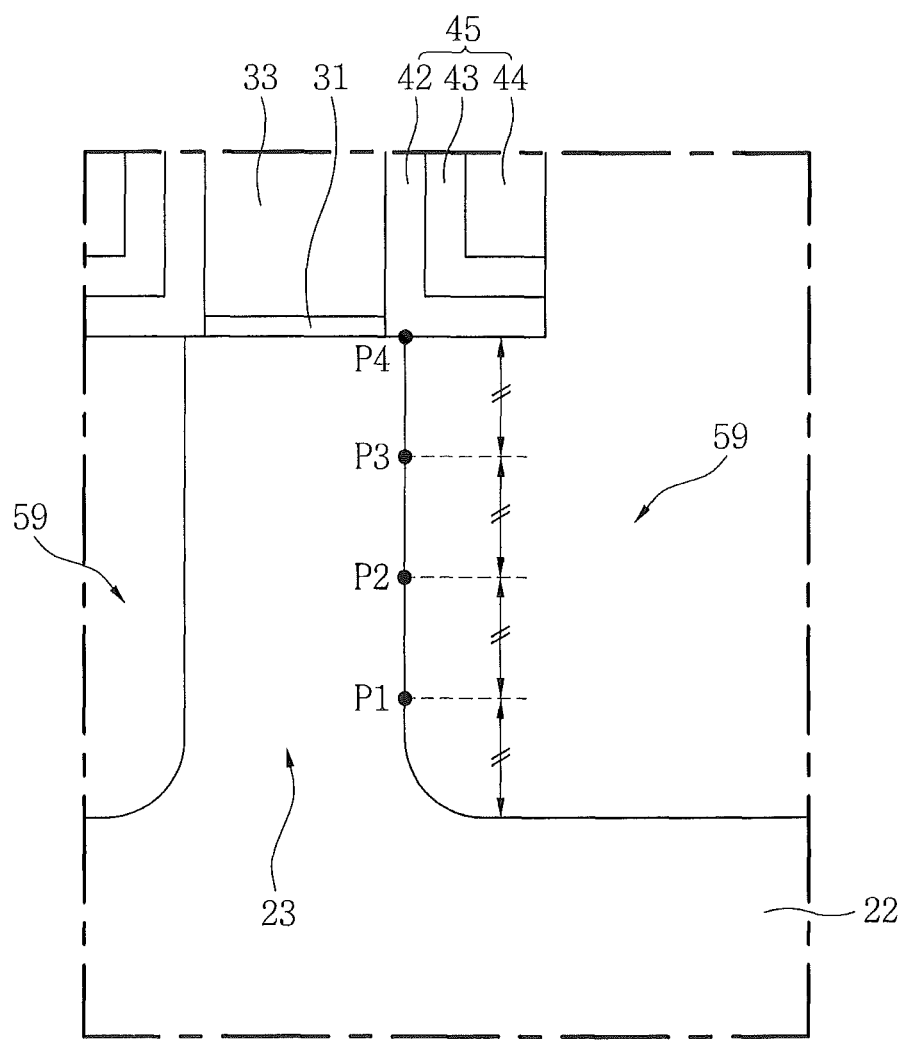
FIG. 12 is an enlarged view showing a part of FIG. 11 in detail.

Referring to FIGS. 1, 2 and 11, trenches 59 may be formed by removing the etching selection regions 57 (Block 530). An isotropic etching process, such as a wet etching process, a dry etching process, or a combination thereof, may be applied to remove the etching selection regions 57. The sidewalls of the trenches 59 may be parallel to the sidewalls of the preliminary trenches 53. The sidewalls of the trenches 59 may have a vertical profile with respect to a surface of the substrate 21. The bottoms of the trenches 59 may be formed at lower levels than the bottom of the temporary gate electrode 33.

In some embodiments, the etching selection regions 57 including impurities having a higher concentration than other regions of the active region 23 may have a higher etch selectivity than other regions of the active region 23. The etching selection regions 57 may have a high etch rate of 100:1 or more with respect to other regions of the active region 23.

Referring to FIG. 12, when one sidewall among a plurality of sidewalls of the trenches 59 is selected/defined and a first quadrant P1, a second quadrant P2, a third quadrant P3 and a fourth quadrant P4 are defined on the selected sidewall, the fourth quadrant P4 may be located on an upper edge of the active region 23, the second quadrant P2 may be located on a horizontal line passing through a vertical midpoint/bisection point between a bottom and a top of the trench 59, the third quadrant P3 may be located between the second quadrant P2 and the fourth quadrant P4, and the first quadrant P1 may be located between a bottom of the trench 59 and the second quadrant P2. A straight line passing through the second quadrant P2 and the third quadrant P3 may be substantially vertical with respect to a surface of the substrate 21. In other words, the straight line may be perpendicular to the surface of the substrate 21. The fourth quadrant P4 may be located on the straight line passing through the second quadrant P2 and the third quadrant P3. The first to fourth quadrants P1, P2, P3 and P4 may be located on one straight line.

Figure 13:
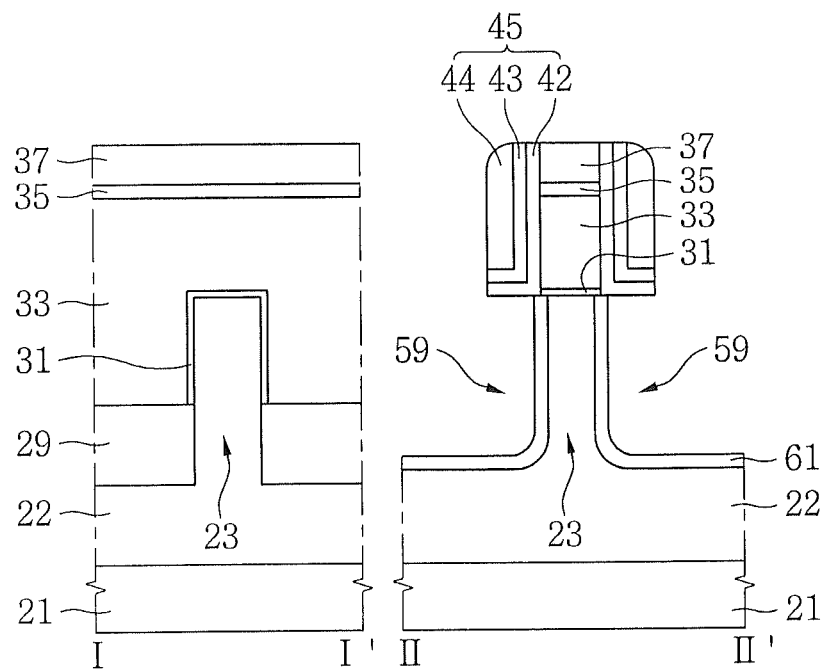

Referring to FIGS. 1, 2 and 13, lightly doped drains (LDDs) 61 may be formed by an ion implanting process into portions of the active region 23 exposed in/by the trenches 59. For example, the active region 23 may include arsenic (As) or phosphorus (P), and the LDDs 61 may be formed by implanting boron (B) into the active region 23. The LDDs 61 may be formed to have uniform thicknesses along/adjacent the trenches 59.

Figure 14:
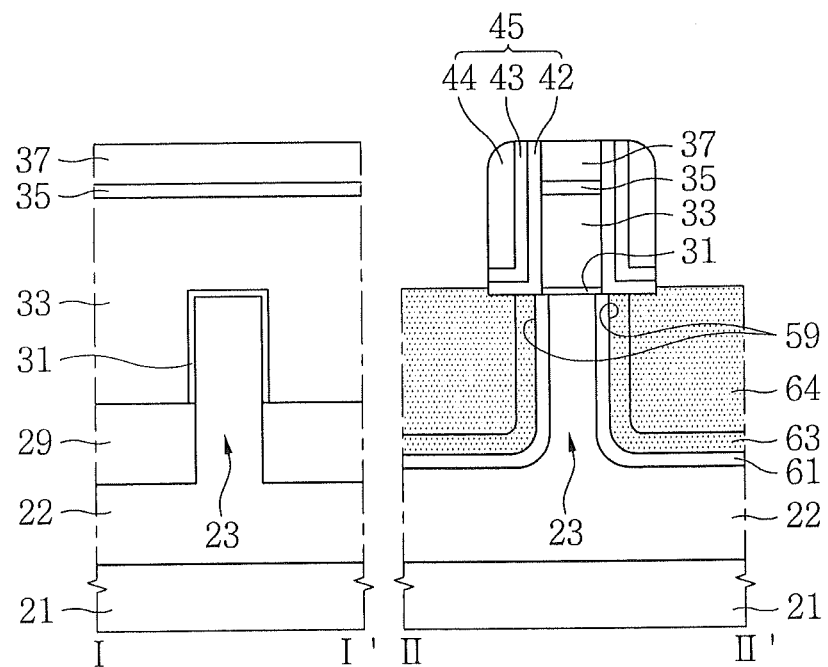

Referring to FIGS. 1, 2 and 14, a first semiconductor layer 63 may be formed in the trenches 59. A second semiconductor layer 64 may be formed on the first semiconductor layer 63. The first semiconductor layer 63 may include Silicon Germanium (SiGe) into which boron (B) is doped by a selective epitaxial growth (SEG) method. The amount of Germanium (Ge) may be 10 to 25% in the first semiconductor layer 63. The amount of boron (B) in the first semiconductor layer 63 may be higher than that of the LDDs 61. The first semiconductor layer 63 may conformally cover the LDDs 61 and may define walls of the trenches 59.

The second semiconductor layer 64 may include SiGe into which boron (B) is doped by the SEG method. The amount of Ge in the second semiconductor layer 64 may be higher than that of the first semiconductor layer 63. The amount of Ge may be 25 to 50% in the second semiconductor layer 64. The amount of boron (B) in the second semiconductor layer 64 may be higher than that of the first semiconductor layer 63. The second semiconductor layer 64 may include boron (B) of 1E20 to 3E20 atoms/cm$^3$. The second semiconductor layer 64 may fully fill the trenches 59. A top of the second semiconductor layer 64 may protrude at/to a higher level than the active region 23.

Figure 15:
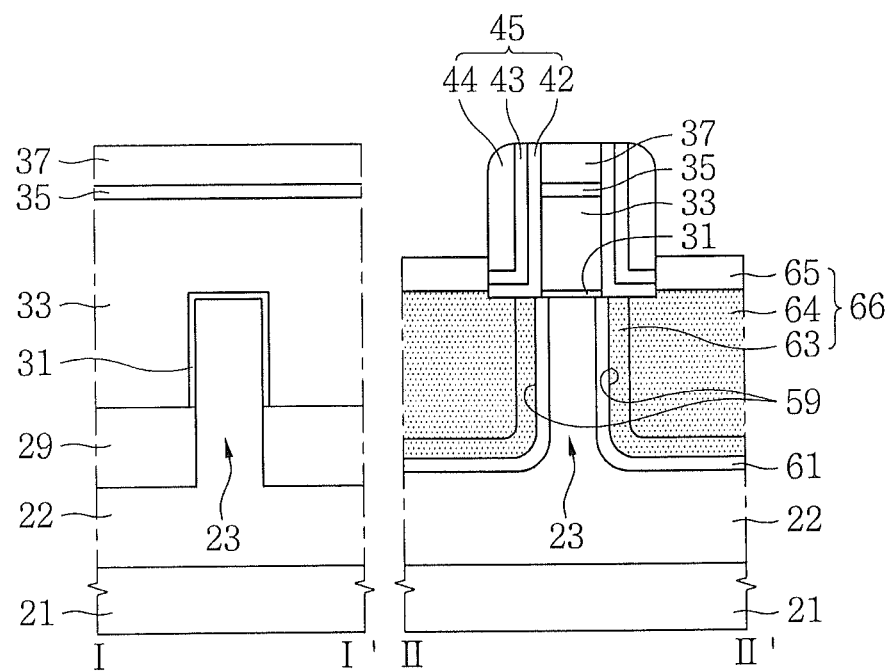

Referring to FIGS. 1, 2 and 15, a third semiconductor layer 65 may be formed on the second semiconductor layer 64. The first semiconductor layer 63, the second semiconductor layer 64 and the third semiconductor layer 65 may configure/provide/form stressors 66 (Block 540). The third semiconductor layer 65 may include Silicon (Si) into which boron (B) is doped by the SEG method. The third semiconductor layer 65 may include boron (B) of 1E20 to 3E20 atoms/cm$^3$. In some embodiments, the first semiconductor layer 63 or the third semiconductor layer 65 may be omitted. Moreover, the stressors 66 may be referred to as an embedded stressor or a strain-inducing pattern.

Figure 16:
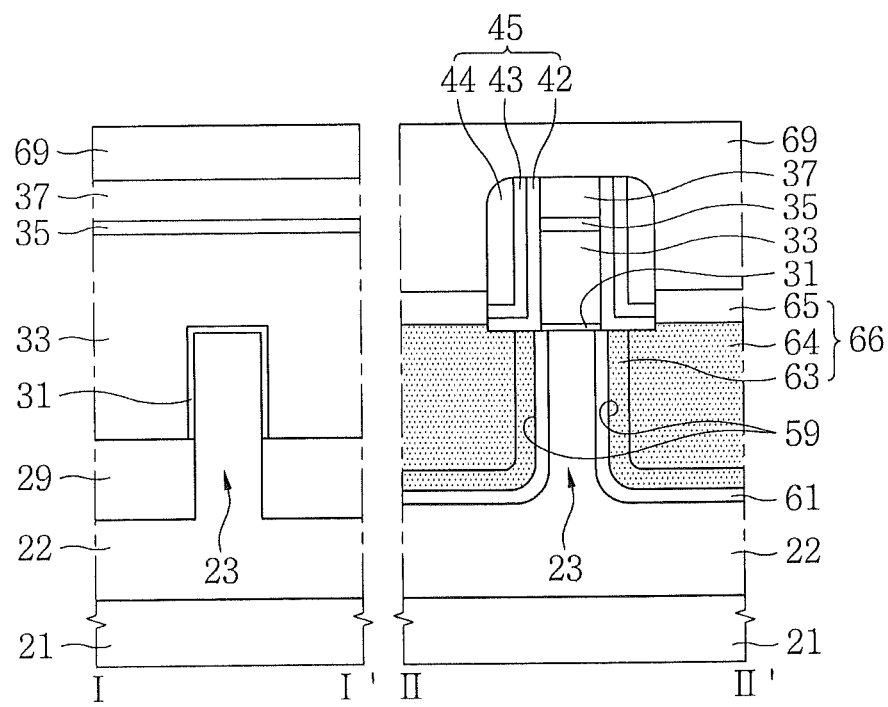

Referring to FIGS. 1, 2 and 16, an interlayer insulating layer 69 may be formed on the substrate 21. The interlayer insulating layer 69 may include an insulating layer such as silicon oxide, silicon nitride, silicon oxynitride, or a combination thereof.

Figure 17:
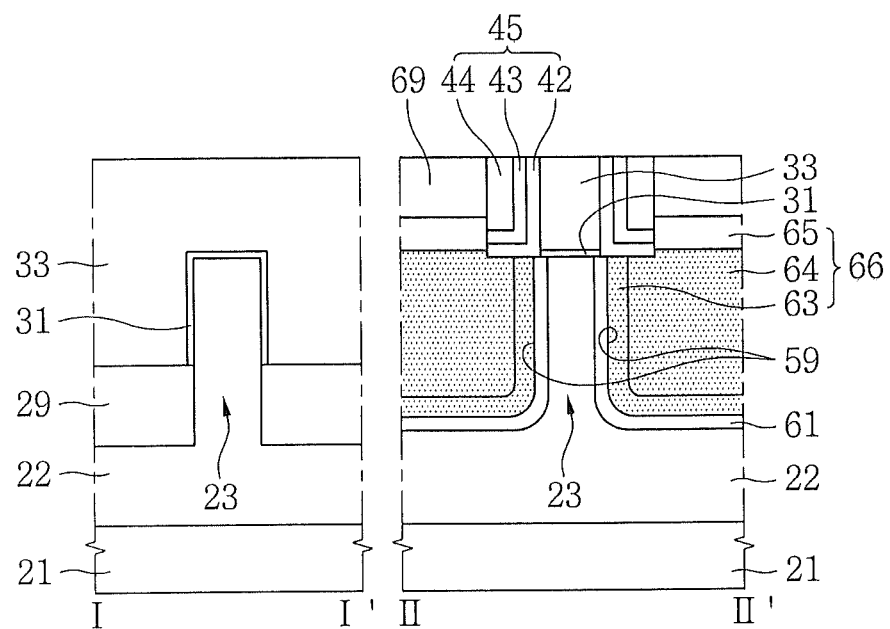

Referring to FIGS. 1, 2 and 17, the temporary gate electrode 33 may be exposed by partially removing the interlayer insulating layer 69, and removing the mask pattern 37 and the buffer pattern 35. A CMP process, an etch-back process, or a combination thereof may be applied to remove the interlayer insulating layer 69, the mask pattern 37 and the buffer pattern 35.

Figure 18:
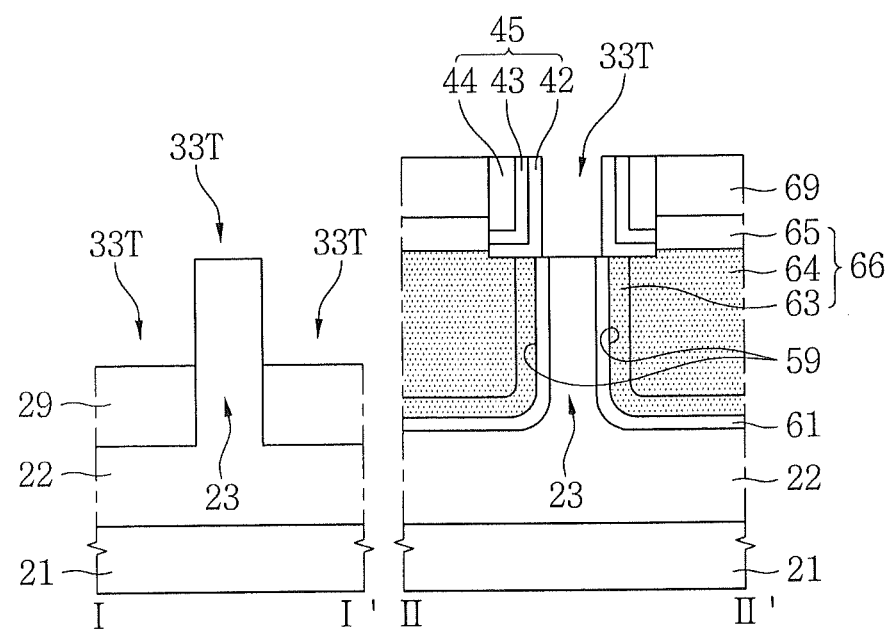

Referring to FIGS. 1, 2 and 18, a gate trench 33T exposing the active region 23 may be formed by removing the temporary gate electrode 33 and the temporary gate dielectric layer 31. An upper surface and side surfaces of the active region 23 may be exposed in/by the gate trench 33T.

Figure 19:
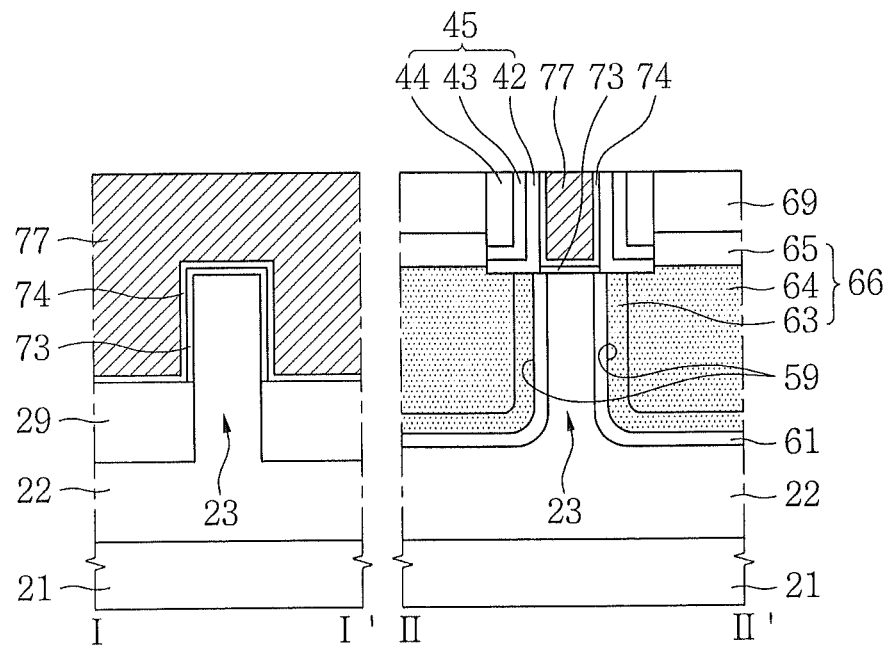

Referring to FIGS. 1, 2 and 19, a first gate dielectric layer 73, a second gate dielectric layer 74, and a gate electrode 77 may be formed in the gate trench 33T. The first gate dielectric layer 73 may be formed on the active region 23.

The first gate dielectric layer 73 may be referred to as an interfacial oxide layer. The first gate dielectric layer 73 may be formed by a cleaning process. The first gate dielectric layer 73 may include silicon oxide. The first gate dielectric layer 73 may be in contact with an upper surface and side surfaces of the active region 23. The second gate dielectric layer 74 may include silicon oxide, silicon nitride, silicon oxynitride, a high-k dielectric layer, or a combination thereof. The second gate dielectric layer 74 may cover the side surface and bottom surface of the gate electrode 77. The first gate dielectric layer 73 may be interposed between the active region 23 and the second gate dielectric layer 74. A thin film forming process and a CMP process may be applied to form the gate electrode 77. The gate electrode 77 may cover the upper surface and side surfaces of the active region 23. The gate electrode 77 may include a conductive layer such as Titanium (Ti), Titanium Nitride (TiN), Titanium Aluminide (TiAl), Titanium-Aluminum Carbide (TiAlC), Tantalum (Ta), Tantalum Nitride (TaN), Tungsten (W), Tungsten Nitride (WN), or a combination thereof.

Referring to FIGS. 1, 2 and 20, the active region 23 may remain between the stressors 66. The gate electrode 77 may cover the upper surface and side surfaces of the active region 23. The bottom surface of the gate electrode 77 may be formed at a lower level than a top surface of the active region 23.

Referring to FIGS. 1, 2 and 21, the trenches 59 may be formed by partially removing the active region 23. Each of the trenches 59 may have a U shape.

Referring to FIGS. 1, 2 and 22, the active region 23 may remain between the stressors 66. The LDDs 61 may be formed between the first semiconductor layer 63 and the active region 23. The gate electrode 77 may cover the side surfaces of the active region 23. The first gate dielectric layer 73 and the second gate dielectric layer 74 may be interposed between the active region 23 and the gate electrode 77.

Figure 23:
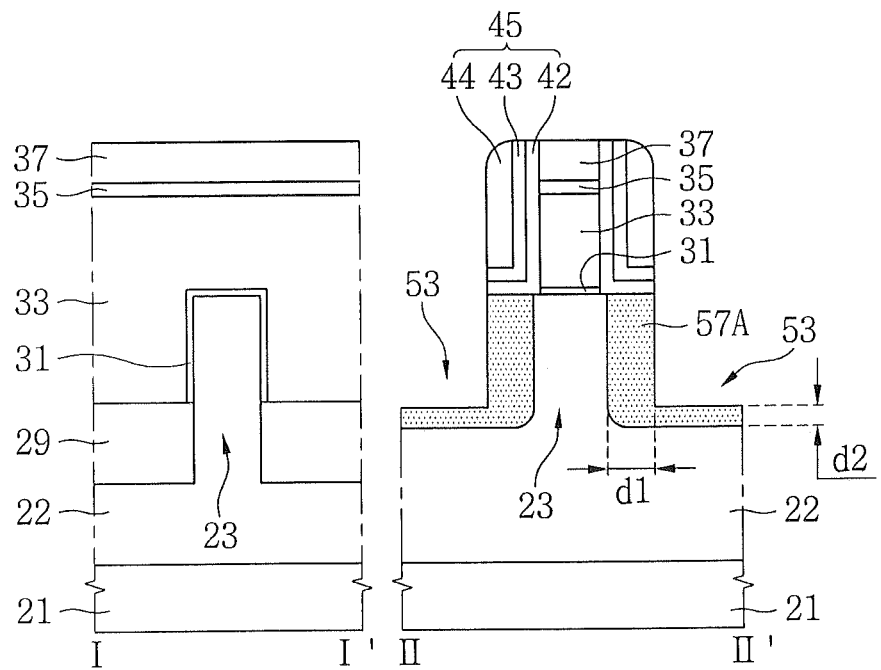
FIGS. 23 and 24 are cross-sectional views taken along lines I-I' and II-II' of FIG. 2 for describing a method of forming a semiconductor device in accordance with various embodiments of present inventive concepts.
Figure 24:
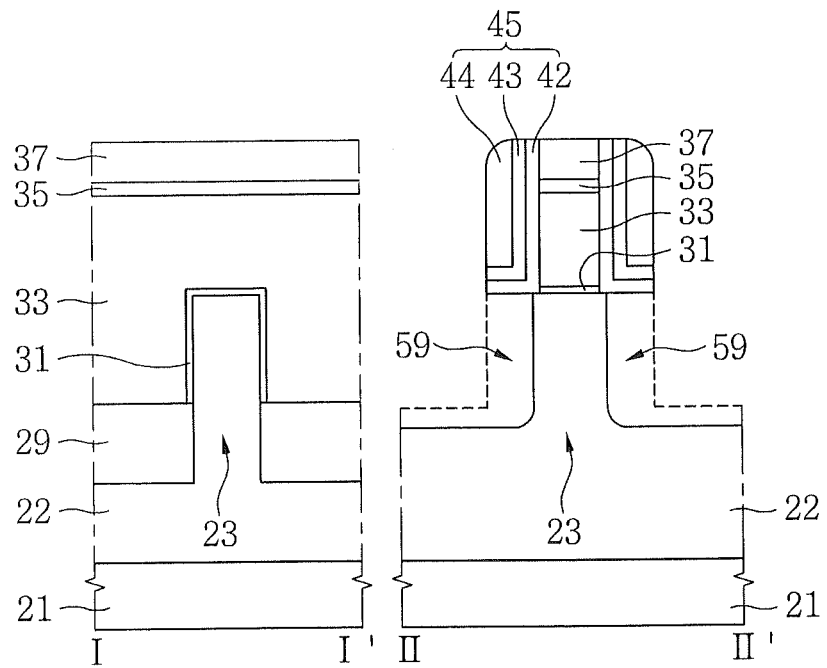

FIGS. 23 and 24 are cross-sectional views taken along lines I-I' and II-II' of FIG. 2 for describing a method of forming a semiconductor device in accordance with various embodiments of present inventive concepts.

Referring to FIGS. 23 and 32, the thicknesses and shapes of the etching selection regions 57A may be controlled by the vertical field applying apparatus 223 and the horizontal field applying apparatus 225. Each horizontal width d1 of the etching selection regions 57A formed adjacent/to define sidewalls of the preliminary trenches 53 may be greater than each vertical thickness d2 of the etching selection regions 57A formed adjacent/to define the bottom of the preliminary trenches 53.

Referring to FIG. 24, the trenches 59 may be formed by removing the etching selection regions 57A. The size and shape of the trenches 59 may depend on the thicknesses and shapes of the etching selection regions 57A.

Figure 25:
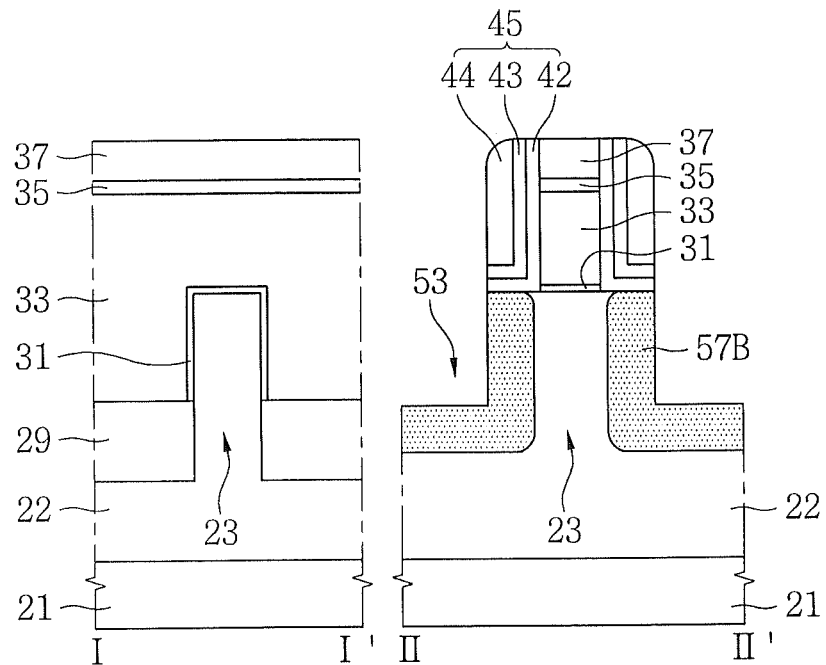
FIGS. 25, 26 and 28 are cross-sectional views taken along lines I-I' and II-II' of FIG. 2 for describing a method of forming a semiconductor device in accordance with various embodiments of present inventive concepts.
Figure 26:
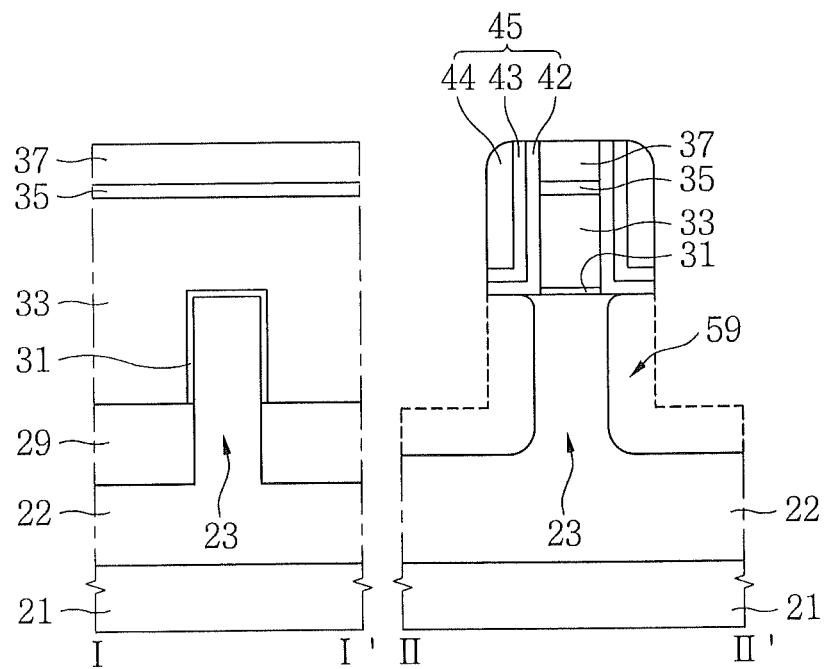
Figure 27:
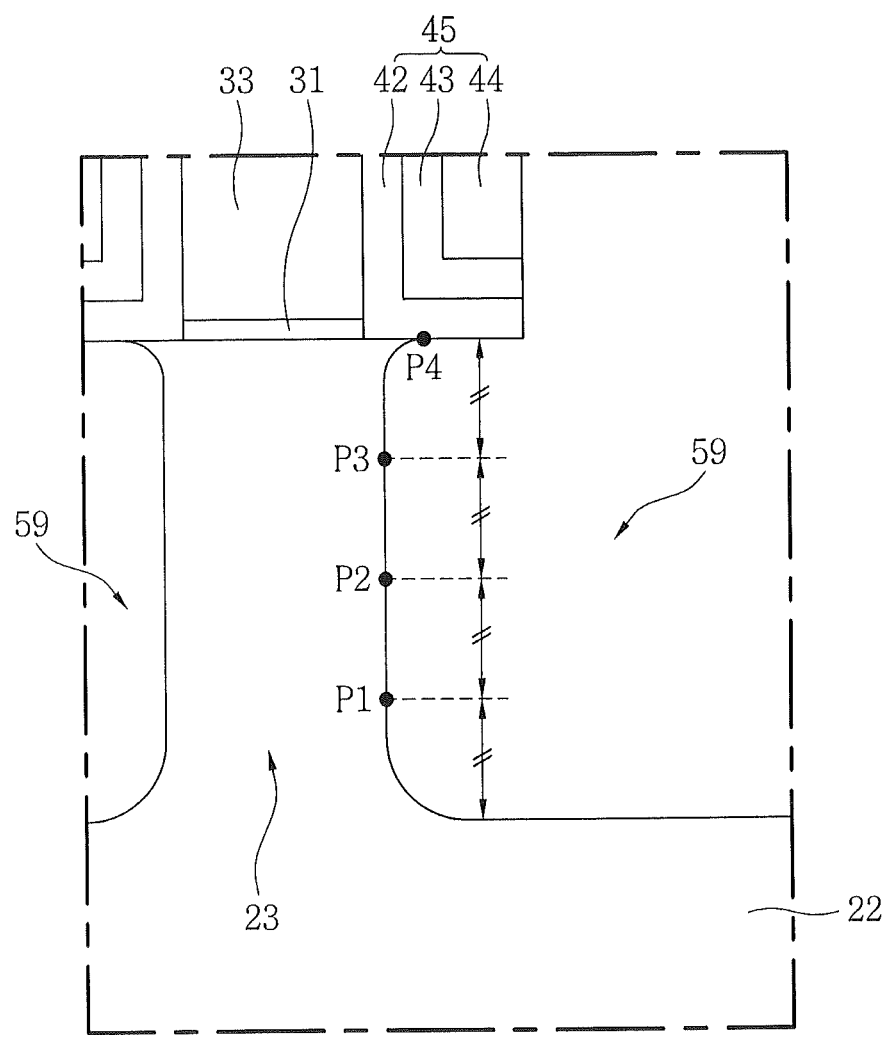
FIG. 27 is an enlarged view showing a part of FIG. 26 in detail.
Figure 28:
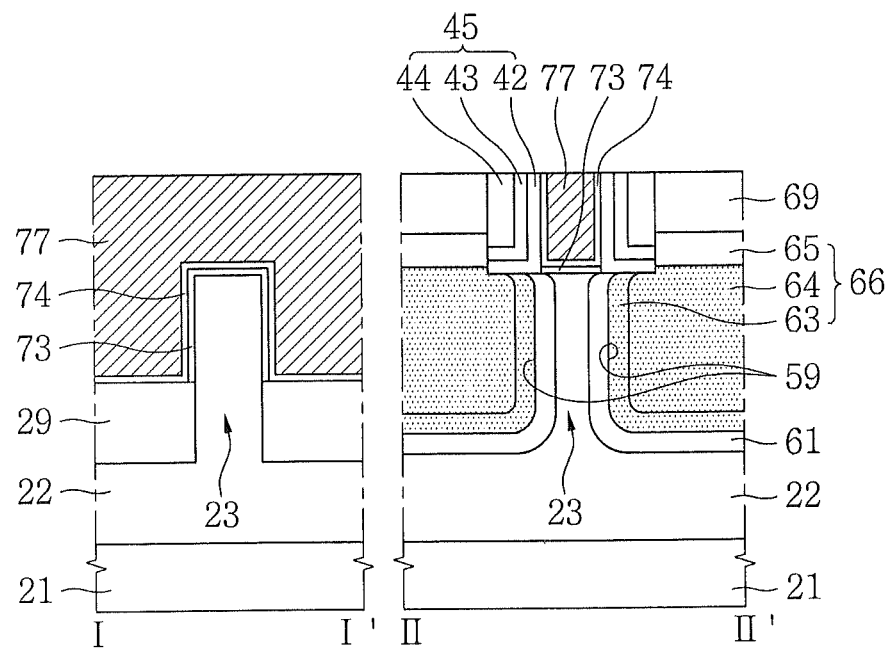
Figure 29:
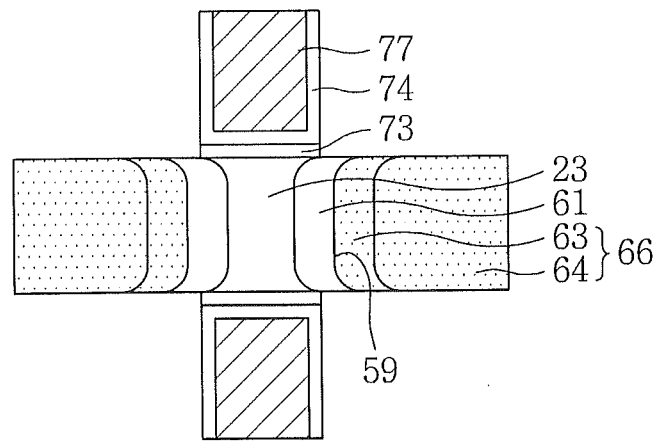
FIG. 29 is a horizontal cross-sectional view of FIG. 28.

FIGS. 25, 26 and 28 are cross-sectional views taken along lines I-I' and II-II' of FIG. 2 for describing a method of forming a semiconductor device in accordance with various embodiments of present inventive concepts. FIG. 27 is an enlarged view showing a part of FIG. 26 in detail, and FIG. 29 is a horizontal cross-sectional view of FIG. 28.

Referring to FIG. 25, etching selection regions 57B may have various shapes. For example, a top region of the etching selection regions 57B may have a smaller width than a middle region of the etching selection regions 57B.

Referring to FIG. 26, the trenches 59 may be formed by removing the etching selection regions 57B. The tops of the active region 23 may protrude horizontally into/toward the trenches 59.

Referring to FIG. 27, the straight line passing through the second quadrant P2 and the third quadrant P3 may be substantially vertical with respect to the surface of the substrate 21. The fourth quadrant P4 may be formed on a different location from the straight line passing through the second quadrant P2 and the third quadrant P3. The fourth quadrant P4 may horizontally protrude into/toward the trenches 59.

Referring to FIG. 28, the LDDs 61 may have uniform thicknesses along/adjacent the trenches 59. The LDDs 61 may be parallel to sidewalls of the active region 23 and may provide/define sidewalls of the trenches 59. Referring to FIG. 29, side surface edges of the active region 23 may protrude into/toward the trenches 59.

Figure 30A:
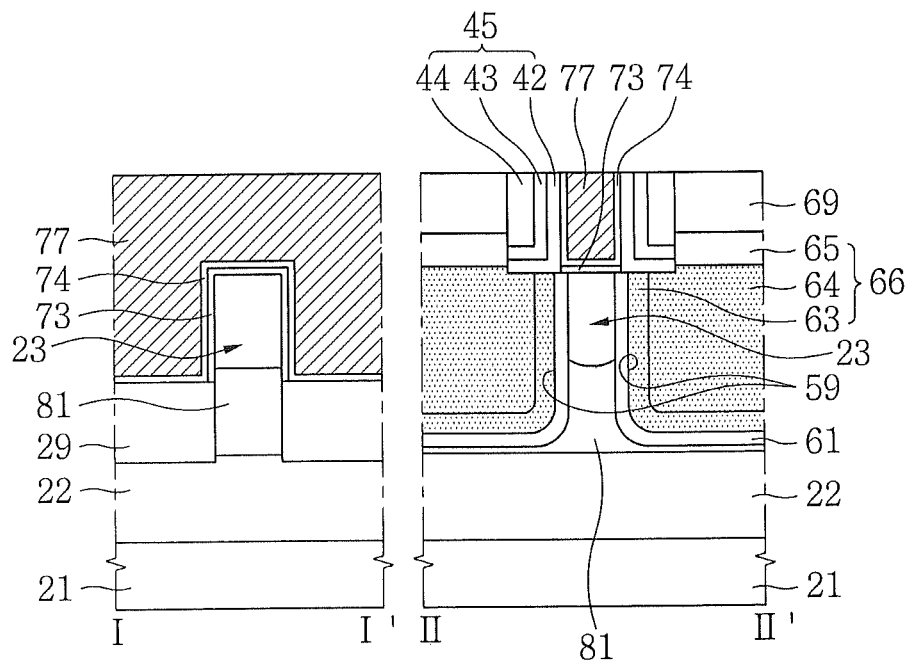
FIGS. 30A to 31 are cross-sectional views taken along lines I-I' and II-II' of FIG. 2 for describing a method of forming a semiconductor device in accordance with various embodiments of present inventive concepts.
Figure 30B:
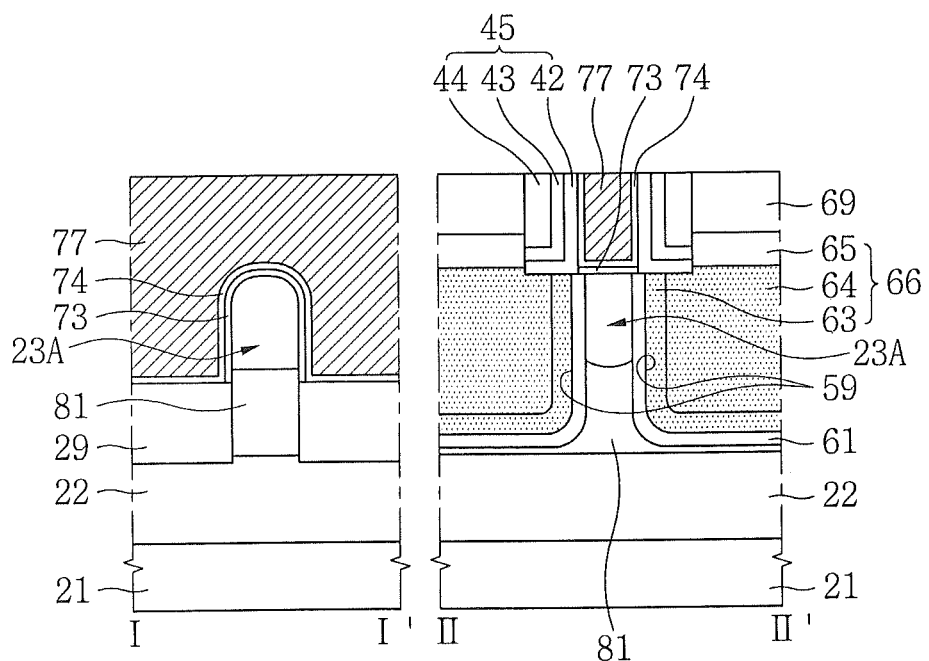
Figure 31:
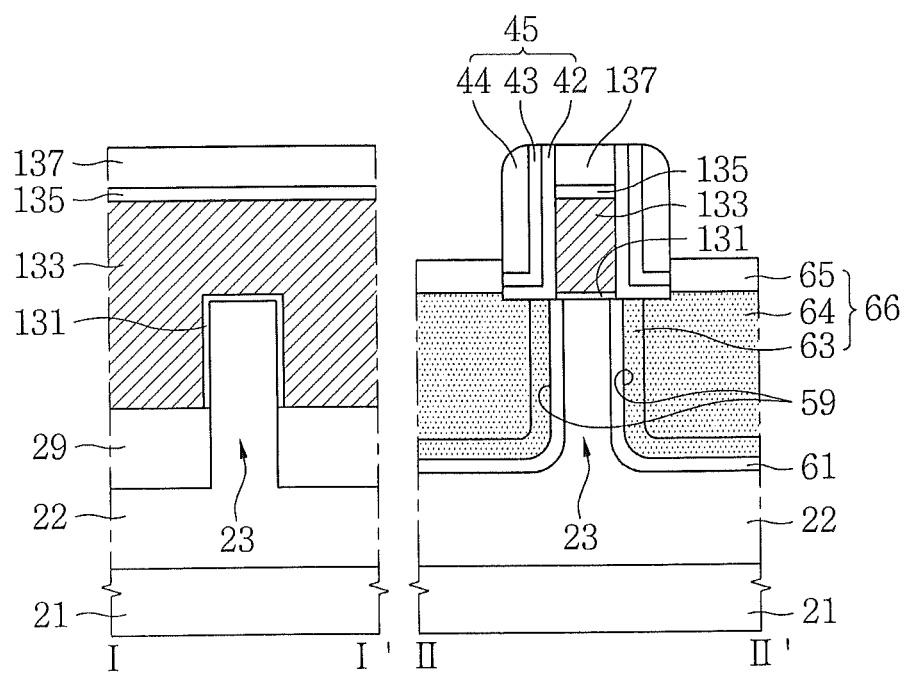

FIGS. 30A to 31 are cross-sectional views taken along lines I-I' and II-II' of FIG. 2 for describing a method of forming a semiconductor device in accordance with various embodiments of present inventive concepts.

Referring to FIG. 30A, halos 81 may be formed in the active region 23. The halos 81 may cover side and bottom surfaces of the LDDs 61. The halos 81 may include impurities having a different conductivity type from the LDDs 61, and the halos 81 may include impurities having the same conductivity type as the N-well 22. For example, the halos 81 may include N-type impurities. The halos 81 may have N-type impurities having a higher concentration than the N-well 22.

Referring to FIG. 30B, upper edges of an active region 23A may be roundly formed (e.g., may be rounded, curved, or otherwise non-planar). For example, the upper edges of the active region 23A may be roundly formed by an active rounding process. A first gate dielectric layer 73, a second gate dielectric layer 74 and a gate electrode 77 may be sequentially formed on the active region 23A.

Referring to FIG. 31, a gate dielectric layer 131, a gate electrode 133, a buffer pattern 135 and a mask pattern 137 may be formed on an active region 23. The gate dielectric layer 131, the gate electrode 133, the buffer pattern 135 and the mask pattern 137 may be referred to as a gate structure.

Figure 35:
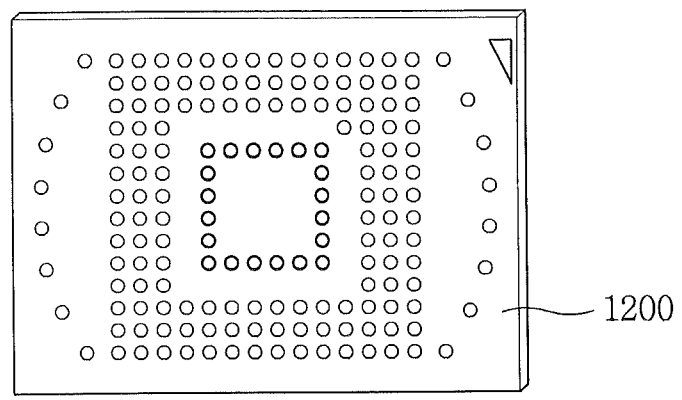
FIGS. 35 to 37 are perspective views of electronic devices in accordance with various embodiments of present inventive concepts.
Figure 36:
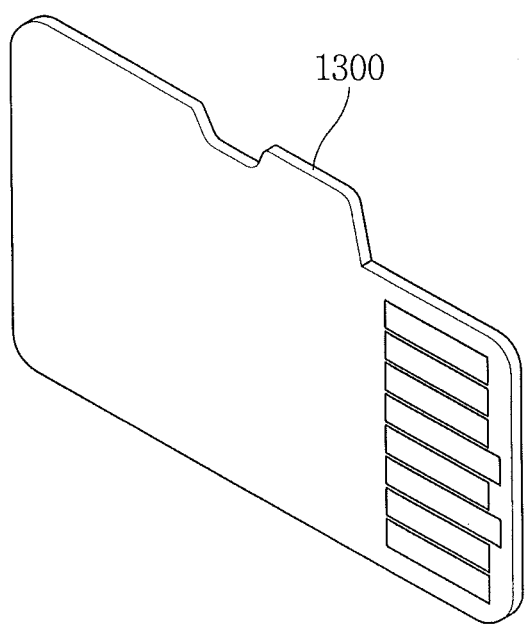
Figure 37:
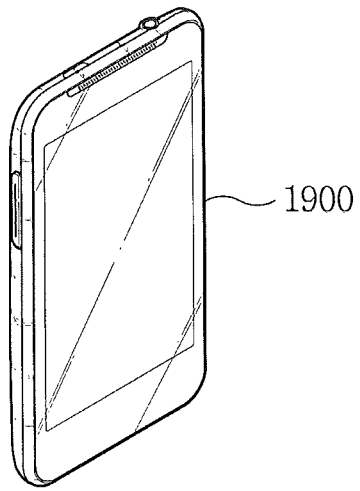
Figure 38:
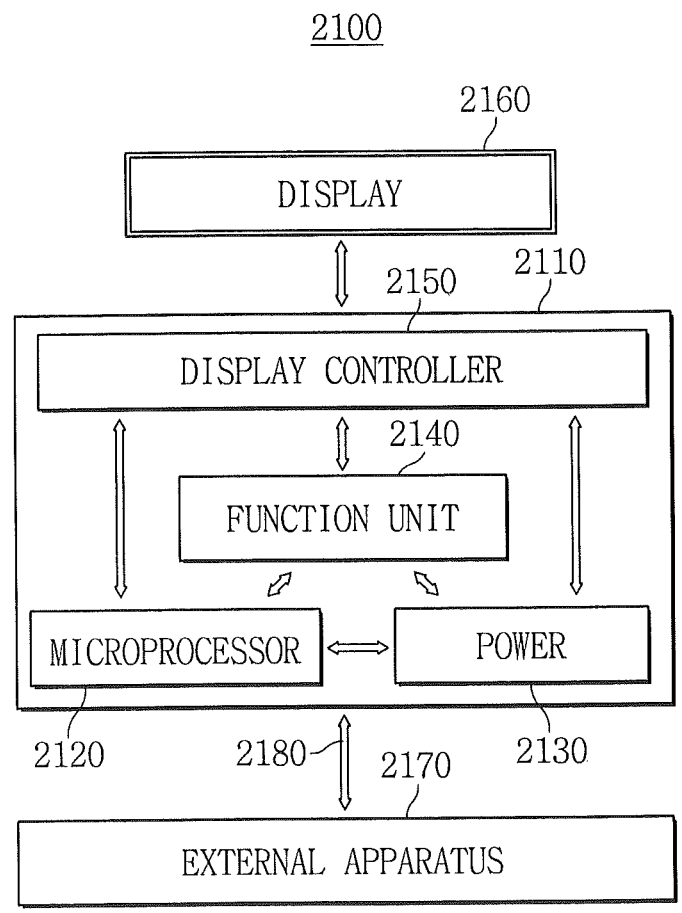
FIG. 38 is a system block diagram of electronic devices in accordance with various embodiments of present inventive concepts.

FIGS. 35 to 37 are perspective views showing electronic devices in accordance with various embodiments of present inventive concepts, and FIG. 38 is a system block diagram of electronic devices in accordance with various embodiments of present inventive concepts.

Referring to FIGS. 35 to 37, the semiconductor device described with reference to FIGS. 1 to 34 may be usefully applied to electronic systems such as an embedded multimedia chip (eMMC) 1200, a micro SD 1300, a smartphone 1900, a netbook, a notebook, or a tablet computer (e.g., a tablet Personal Computer (PC) or other tablet computer). For example, a semiconductor device similar to those described with reference to FIGS. 1 to 34 may be mounted on a mainboard in the smartphone 1900. A semiconductor device similar to those described with reference to FIGS. 1 to 34 may be provided to an expansion apparatus such as the micro SD 1300, and combined with the smartphone 1900.

Referring to FIG. 38, a semiconductor device similar to those described with reference to FIGS. 1 to 34 may be applied to an electronic system 2100. The electronic system 2100 may include a body 2110, a microprocessor unit 2120, a power unit 2130, a function unit 2140, and a display controller unit 2150. The body 2110 may be a motherboard formed of a printed circuit board (PCB). The microprocessor unit 2120, the power unit 2130, the function unit 2140, and the display controller unit 2150 may be installed on the body 2110. A display unit 2160 may be disposed on the inside or outside of the body 2110. For example, the display unit 2160 may be disposed on a surface of the body 2110 and display an image processed by the display controller unit 2150.

The power unit 2130 may receive a constant voltage from an external battery, divide the voltage into various levels, and supply those voltages to the microprocessor unit 2120, the function unit 2140, and the display controller unit 2150, etc. The microprocessor unit 2120 may receive a voltage from the power unit 2130 to control the function unit 2140 and the display unit 2160. The function unit 2140 may perform various functions of the electronic system 2100. For example, when the electronic system 2100 is a smartphone, the function unit 2140 may have several components that perform functions of the mobile phone such as outputting an image on the display unit 2160 or outputting a voice to a speaker, by dialing/typing or communication with an external apparatus 2170. When a camera is installed, the function unit 2140 may serve as a camera image processor.

In some embodiments of present inventive concepts, when the electronic system 2100 is connected to a memory card to expand capacity, the function unit 2140 may be a memory card controller. The function unit 2140 may exchange signals with the external apparatus 2170 through a wired or wireless communication unit 2180. In addition, when the electronic system 2100 uses a universal serial bus (USB) to expand functionality, the function unit 2140 may serve as an interface controller. Further, the function unit 2140 may include a mass storage apparatus. A semiconductor device similar to those described with reference to FIGS. 1 to 34 may be applied to the function unit 2140 or the microprocessor unit 2120.

According to various embodiments of present inventive concepts described herein, a preliminary trench can be formed in a fin active region by anisotropically etching the fin active region (or an active region of another type of multi-gate structure). An etching selection region can be formed in the preliminary trench by a plasma ion implanting apparatus. A trench can be formed by removing the etching selection region. A stressor can be formed in the trench. A sidewall of the trench can have a vertical profile. In particular, an interval (e.g., a thickness/shape of one or more intervening layers) between a gate electrode and the stressor may be uniformly controlled/provided. A semiconductor device having improved electrical characteristics can thus be provided.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A method of forming a semiconductor device, the method comprising:

forming a gate structure on a fin active region that is on a substrate;

forming preliminary trenches by anisotropically etching the fin active region;

forming etching selection regions in portions of the fin active region that are exposed by the preliminary trenches, wherein the etching selection regions comprise a first impurity concentration that is higher than a second impurity concentration in the fin active region, and wherein forming the etching selection regions comprises forming a horizontal width of portions of the etching selection regions defining sidewalls of the preliminary trenches that is greater than a vertical thickness of portions of the etching selection regions that are perpendicular to the horizontal width;
forming trenches in the fin active region adjacent opposing sides of the gate structure, by removing the etching selection regions; and
forming a stressor in the trenches.

2. The method of claim 1, wherein forming the preliminary trenches comprises forming sidewalls of the preliminary trenches that are substantially perpendicular to a surface of the substrate.

3. The method of claim 1, wherein forming the trenches comprises forming sidewalls of the trenches in parallel to where sidewalls of the preliminary trenches were formed.

4. The method of claim 1, wherein:
forming the gate structure comprises forming a temporary gate structure on the fin active region; and
forming the trenches comprises forming the trenches in the fin active region adjacent opposing sides of the temporary gate structure.

5. The method of claim 4, further comprising:
removing the temporary gate structure; and
forming a gate electrode on the fin active region.

6. The method of claim 4, further comprising forming a spacer on a sidewall of the temporary gate structure, wherein forming the etching selection regions comprises forming one of the etching selection regions to undercut the spacer.

7. The method of claim 6,
wherein forming the gate structure comprises forming the gate structure on opposing sides of the fin active region, and
wherein forming the preliminary trenches comprises forming the preliminary trenches after forming the spacer.

8. The method of claim 1, wherein forming the etching selection regions comprises forming the etching selection regions with a uniform thickness adjacent the preliminary trenches.

9. The method of claim 1, further comprising forming lightly doped drains (LDDs) to a uniform width in portions of the fin active region that are exposed after forming the trenches, wherein forming the stressor comprises forming the stressor after forming the LDDs.

10. The method of claim 1, wherein forming the etching selection regions comprises:
forming the etching selection regions by implanting impurities into the fin active region.

11. The method of claim 10,
wherein forming the etching selection regions comprises loading the substrate into a plasma chamber,
wherein the plasma chamber includes:
a horizontal field applying apparatus adjacent a side surface of the substrate; and
a vertical field applying apparatus adjacent a rear surface of the substrate, and
wherein forming the etching selection regions further comprises implanting the impurities by applying an electric field and/or a magnetic field via the horizontal field applying apparatus and the vertical field applying apparatus to the substrate.

12. The method of claim 1, wherein forming the etching selection regions comprises:
loading the substrate comprising the preliminary trenches into a plasma chamber;
applying an electric field and/or a magnetic field to a side surface and a rear surface of the substrate; and
implanting impurities into the portions of the fin active region that are exposed by the preliminary trenches.

13. A method of forming a semiconductor device, the method comprising:
forming a gate structure on a fin active region that is on a substrate;
forming preliminary trenches by anisotropically etching the fin active region;
forming etching selection regions in portions of the fin active region that are exposed by the preliminary trenches, wherein the etching selection regions comprise a first impurity concentration that is higher than a second impurity concentration in the fin active region, and wherein forming the etching selection regions comprises forming a horizontal width of portions of the etching selection regions defining sidewalls of the preliminary trenches that equals a vertical thickness of portions of the etching selection regions that are perpendicular to the horizontal width;
forming trenches in the fin active region adjacent opposing sides of the gate structure, by removing the etching selection regions; and
forming a stressor in the trenches.

14. The method of claim 13, wherein forming the etching selection regions comprises:
loading the substrate comprising the preliminary trenches into a plasma chamber;
applying an electric field and/or a magnetic field to a side surface and a rear surface of the substrate; and
implanting impurities into the portions of the fin active region that are exposed by the preliminary trenches.

15. A method of forming a semiconductor device, the method comprising:
forming a gate structure on a fin active region that is on a substrate;
forming preliminary trenches by anisotropically etching the fin active region;
forming etching selection regions in portions of the fin active region that are exposed by the preliminary trenches, wherein the etching selection regions comprise a first impurity concentration that is higher than a second impurity concentration in the fin active region, and wherein forming the etching selection regions comprises:
loading the substrate comprising the preliminary trenches into a plasma chamber;
applying an electric field and/or a magnetic field to a side surface and a rear surface of the substrate; and
implanting impurities into the portions of the fin active region that are exposed by the preliminary trenches;
forming trenches in the fin active region adjacent opposing sides of the gate structure, by removing the etching selection regions; and
forming a stressor in the trenches.

16. The method of claim 15,
wherein the plasma chamber includes:
a horizontal field applying apparatus adjacent the side surface of the substrate; and
a vertical field applying apparatus adjacent the rear surface of the substrate, and
wherein applying the electric field and/or the magnetic field comprises applying the electric field and/or the magnetic field via the horizontal field applying apparatus and the vertical field applying apparatus.

17. The method of claim 15, further comprising:
forming lightly doped drains (LDDs) in portions of the fin active region that are exposed by the trenches, wherein forming the stressor comprises forming the stressor on at least one of the LDDs.

18. The method of claim 17, wherein forming the LDDs comprises forming each of the LDDs to a uniform thickness in the fin active region.

19. The method of claim 15, wherein forming the etching selection regions comprises forming a horizontal width of portions of the etching selection regions defining sidewalls of the preliminary trenches that is greater than a vertical thickness of portions of the etching selection regions that are perpendicular to the horizontal width.

20. The method of claim 15, wherein forming the etching selection regions comprises forming a horizontal width of portions of the etching selection regions defining sidewalls of the preliminary trenches that equals a vertical thickness of portions of the etching selection regions that are perpendicular to the horizontal width.

* * * * *